(12) United States Patent
Siska

(10) Patent No.: US 8,786,356 B2
(45) Date of Patent: Jul. 22, 2014

(54) CONDUCTIVE SHIELD FOR SHAPING AN ELECTRIC FIELD OF A CONDUCTIVE WIRE

(75) Inventor: Andrew Siska, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/539,648

(22) Filed: Jul. 2, 2012

(65) Prior Publication Data

US 2013/0120052 A1    May 16, 2013

Related U.S. Application Data

(60) Provisional application No. 61/559,690, filed on Nov. 14, 2011.

(51) Int. Cl.
*H03K 17/945* (2006.01)

(52) U.S. Cl.
USPC .......................................................... 327/517

(58) Field of Classification Search
USPC ................................. 327/509, 517
See application file for complete search history.

(56) References Cited

U.S. PATENT DOCUMENTS

| | | | |
|---|---|---|---|
| 6,376,939 B1 * | 4/2002 | Suzuki et al. | 307/326 |
| 6,400,359 B1 * | 6/2002 | Katabami | 345/173 |
| 6,989,679 B2 * | 1/2006 | Lieder et al. | 324/688 |
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2003/0080755 A1 * | 5/2003 | Kobayashi | 324/658 |
| 2009/0315854 A1 | 12/2009 | Matsuo | |
| 2011/0279409 A1 | 11/2011 | Salaverry et al. | |
| 2012/0074961 A1 | 3/2012 | Herrmann | |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2013/0120310 A1 | 5/2013 | Siska | |
| 2013/0241780 A1 | 9/2013 | Amm et al. | |

FOREIGN PATENT DOCUMENTS

WO    WO 2012/129247    9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.
U.S. Appl. No. 13/523,372, filed Jun. 14, 2012, Andrew Siska.
A. Siska, U.S. Appl. No. 13/523,372, Non-final Office Action from U.S. Patent Office. Jan. 15, 2014.
Bryce Osoinach, "Proximity Capacitive Sensor Technology for Touch Sensing Applications," 2008, Freescale Semiconductor, Inc. 2008.
A. Siska, U.S. Appl. No. 13/523,372, Response to Non-final Office Action from U.S. Patent Office. Apr. 15, 2014.

* cited by examiner

*Primary Examiner* — Jeffrey Zweizig
(74) *Attorney, Agent, or Firm* — Baker Botts LLP

(57) ABSTRACT

In one embodiment, a method comprises generating, by a control unit, a first drive signal and a second drive signal. The method further comprises emitting, by a conductive wire coupled to a capacitive touch sensor, a first electric field that extends in a plurality of directions in response to reception of the first drive signal. The method further comprises shaping, by a conductive shield that surrounds the conductive wire, at least a portion of the first electric field that extends from the capacitive touch sensor towards the conductive shield by generating a second electric field in response to reception of the second drive signal.

20 Claims, 4 Drawing Sheets

CONDUCTIVE SHIELD FOR SHAPING AN ELECTRIC FIELD OF A CONDUCTIVE WIRE

RELATED APPLICATION

This application claims benefit under 35 U.S.C. §119(e) of U.S. Provisional Application Ser. No. 61/559,690, entitled "PROXIMITY SENSING," filed Nov. 14, 2011.

TECHNICAL FIELD

This disclosure relates generally to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine whether an object is touching or in proximity with the touch sensor or to determine the location of the touch or proximity with respect to the touch sensor.

DESCRIPTION OF EXAMPLE EMBODIMENTS

Figure 1:
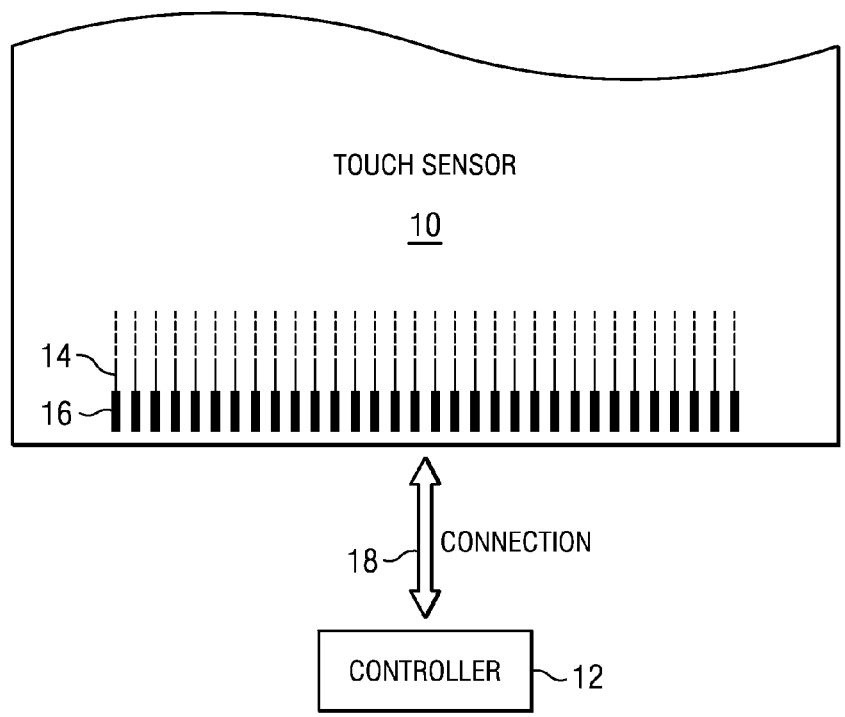
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of one or more drive and sense electrodes (or an array of one or more electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line (e.g., a trace disposed on a horizontal or vertical section of a substrate), wire, loop, patch, other suitable two dimensional or three dimensional shape, or any suitable combination of these. In particular embodiments, one or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of polyethylene terephthalate (PET) or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of PET or another suitable material, such as a dielectric material. In a particular embodiment, the substrate is a printed circuit board with one or more layers. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. In other particular embodiments, the drive or sense electrodes include one or more sheets of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of one or more drive and sense electrodes forming an array of one or more capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of one or more electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. As used herein, a proximity input may refer to the location of an object in proximity to a touch sensor. For example, a proximity input may be detected when an object is within a certain distance (e.g., 25 centimeters) from the touch sensor. An object may be any suitable entity or thing that may couple the touch sensor 10a to ground through a capacitance of the object. For example, an object may be a human finger, hand, other body part, a stylus or other input device held by a human, or other suitable capacitive entity. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 µm or less. As another example, the conductive material of tracks 14 may be silver or silver-based and have a width of approximately 100 µm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor.

Figure 2:
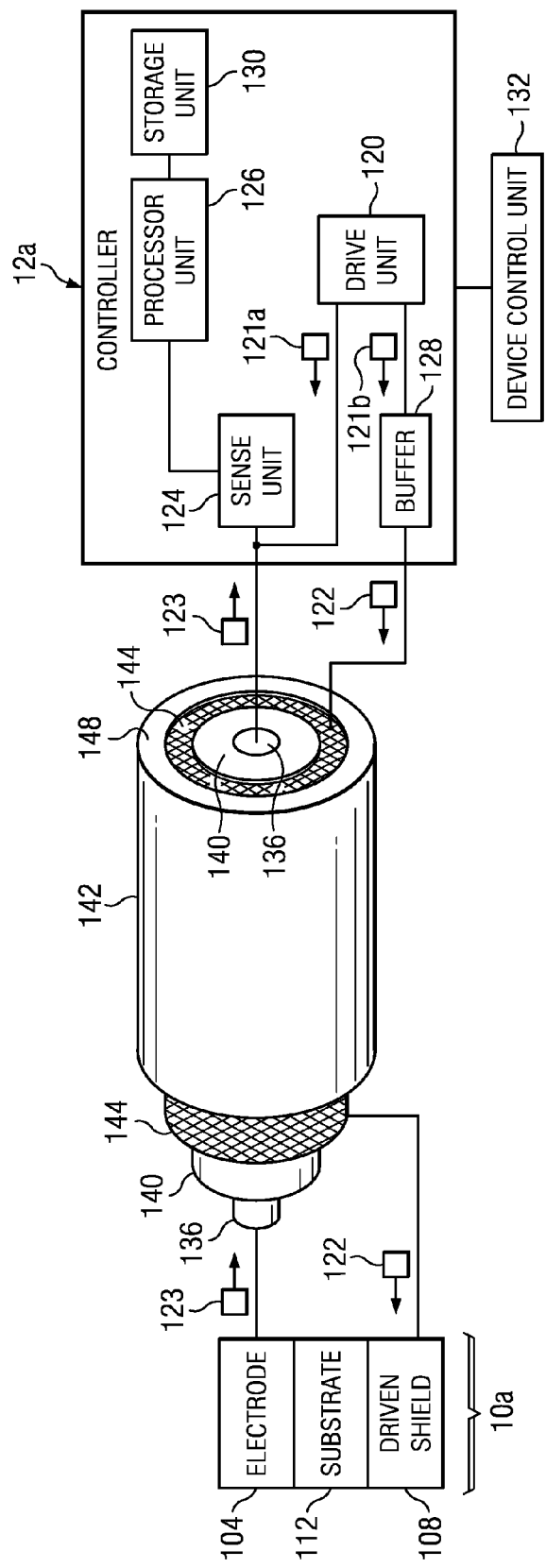
FIG. 2 illustrates an example system including an example conductive shield for shaping an electric field of an example conductive wire coupled to an example touch sensor.

FIG. 2 illustrates an example system including a conductive shield 144 for shaping an electric field of an example conductive wire 136 coupled to touch sensor 10a. Touch sensor 10a may include any suitable characteristics listed above with respect to touch sensor 10. In the embodiment depicted, touch sensor 10a includes an electrode 104, a driven shield 108, and a substrate 112 that insulates electrode 104 from driven shield 108. Electrode 104 and substrate 112 may have any suitable characteristics of the electrodes and substrates described above in connection with FIG. 1. The electrode 104 and driven shield 108 are coupled to touch-sensor controller 12a via coaxial cable 142. Touch-sensor controller 12a may include any suitable characteristics described above with respect to touch-sensor controller 12. Touch-sensor controller 12a includes drive unit 120 for generating drive signals 121, buffer 128 for generating drive signal 122, sense unit 124 for analyzing sense signal 123 and detecting, by itself or in conjunction with processor unit 126, whether a touch or proximity input has occurred at electrode 104, and storage unit 130 for facilitating the operation of processor unit 126. Drive unit 120, sense unit 124, processor unit 126, and storage unit 130 may include any suitable characteristics of the drive unit, sense unit, processor unit, and storage unit described in connection with FIG. 1. Coaxial cable 142 includes conductive wire 136, dielectric layer 140, conductive shield 144, and insulating jacket 148.

The system of FIG. 2 may be incorporated within a device that may perform one or more actions in response to the detection of a touch or the detection that a touch has been removed. For example, the device may be a vehicle or other engine-powered machine, thermostat, light, stereo, television, remote control, household or other appliance, desktop computer, laptop computer, tablet computer, personal digital assistant (PDA), smartphone, satellite navigation device, portable media player, portable game console, kiosk computer, point-of-sale device, or other suitable device.

In particular embodiments, touch sensor 10a is located remotely from controller 12a. For example, the length of coaxial cable may be greater than 10 centimeters, or even greater than 1 meter. Due to the distance between controller 12a and touch sensor 10a, the signals travelling between touch sensor 10a and controller 12a may be subject to attenuation. For example, if coaxial cable 142 is located within or adjacent to a metal object such as a steering column, a bundle of wires, or other conductive object coupled to ground, the electric field generated due to the signal carried by conductive wire 136 may extend outwardly from conductive wire 136, past insulating jacket 148, and into these other objects. Such attenuation may be problematic because touch or proximity detection generally relies on the integrity of relatively small electrical signals sent between controller 12a and touch sensor 10a. For example, if a drive signal sent to touch sensor 10a is attenuated, controller 12a may not be able to adequately charge touch sensor 10a for touch measurements. As another example, the measurement signal sent from electrode 104 to sense unit 124 may not be indicative of the actual charge stored at electrode 104.

Particular embodiments of the present disclosure utilize a conductive shield 144 to shape the electric field generated by conductive wire 136 of coaxial cable 142 to reduce or eliminate electric field coupling into objects outside of coaxial cable 142. For example, when conductive shield 144 is driven with a signal that is similar to the signal passing through conductive wire 136, conductive shield 144 may generate an electric field that opposes the electric field generated by conductive wire 136. In such a situation, the modified electric field from conductive wire 136 does not extend as far as it would in the absence of the driving of conductive shield 144. Such constraining of the electric field generated by conductive wire 136 may result in a reduction or elimination of the signal attenuation resulting from the electric field coupling to objects outside of coaxial cable 142.

FIG. 2 depicts a self capacitance sensing system that may modify an electric field of conductive wire 136. The system includes a sense electrode 104 disposed on a substrate 112, such as a printed circuit board. In particular embodiments, electrode 104 is a single-layer conductor. In another embodiment, electrode 104 is an exposed portion of conductive wire 136 that is not surrounded by dielectric layer 140, conductive shield 144, and insulating jacket 148. Touch-sensor controller 12a may charge electrode 104 to a known potential. The touch-sensor controller 12a may then measure the charge of electrode 104 after one or more charge-and-transfer cycles and determine the capacitance of the electrode 104. Placing an object on or near the electrode 104 can introduce external capacitance that affects the flow of charge at the location of the object. This can register as a touch or proximity input. A self capacitance sensing system may measure a touch or proximity input by using the self capacitance of the electrode 104. In particular embodiments, a self capacitance sensing system may detect proximity of an object within a range, such as 25 cm, from electrode 104. A self capacitance sensing system may use parallel or sequential sensor measurement. In particular embodiments, a self capacitance sensing system may comprise two pins connecting the electrode 104 to a sense unit 124, a series resistor for reducing emission conducted noise, and a sampling capacitor for each electrode 104. The voltage across the sampling capacitor may be compared with a threshold voltage during measurement of the capacitance at electrode 104. In other particular embodiments, a self capacitance sensing system may comprise one pin connecting electrode 104 to sense unit 124 and one resistor per electrode 104. In such embodiments, the voltage at the electrode 104 may be measured using an analog-to-digital (ADC) converter of sense unit 124.

Coaxial cable 142 may transport signals between touch sensor 10a and controller 12a. Coaxial cable includes a conductive wire 136 located along the central axis of coaxial cable 142. Conductive wire 136 may comprise any suitable conductive material such as one or more of copper, silver, iron, steel, gold, or other conductive material. Conductive wire 136 may be solid or stranded wire. Dielectric layer 140 surrounds conductive wire 136 and may include any suitable insulating material, including one or more of polyethylene or other plastic, air or other gas, teflon, or other insulating material. Conductive shield 144 may surround conductive wire 136 and dielectric layer 140 and may comprise any suitable conductive material such as one or more of copper, silver, iron, steel, gold, or other conductive material. Conductive shield 144 may be solid or stranded wire, and in some embodiments, is braided. Conductive shield 144, dielectric layer 140, and conductive wire 136 may all share the same central axis (with the axis co-located with conductive wire 136). Insulating jacket 148 may be any suitable insulating material, such as polyethylene or other plastic, Teflon, rubber, or other insulating material. In particular embodiments, coaxial cable is substantially flexible.

During operation of touch sensor 10a, conductive wire 136 may transport drive signals from drive unit 120 to electrode 104 and measurement signals from electrode 104 to sense unit 124. Conductive shield 144 may transport signals from buffer 128 to driven shield 108. In another embodiment, driven shield 108 may be omitted and conductive shield 144 is not connected to touch sensor 10a. Conductive shield 144 is configured to generate an electrical field in response to receiving drive signal 122. The electrical field generated by conductive shield 144 may shape the electrical field of conductive wire 136. In particular embodiments, drive signal 122 used to drive conductive shield 144 is the same signal or substantially similar to the drive signal 121a used to drive conductive wire 136. Accordingly, the electrical fields generated by conductive wire 136 and conductive shield 144 may have the same or substantially similar phases and polarities. For example, in a particular embodiment, the phase difference between the electrical field generated by conductive wire 136 and the electrical field generated by conductive shield 144 is less than 10 percent. That is, a phase delay of either electric field with respect to the other is less than 1/10 of the period of the electric fields. In other examples, the phase difference may be less than 5 percent or less than 1 percent. Similar phases will result in better operation since dissimilar phases between the electric fields will result in absorption by conductive shield 144 of the electric field generated by conductive wire 136. At least a portion of the electric field generated by conductive shield 144 in response to receiving drive signal 122 may extend towards conductive wire 136. This portion of the electric field of conductive shield 144 may effectively reduce the length of the electric field lines of at least a portion of the electric field of conductive wire 136 that extend towards conductive shield 144 because charges of the same polarity repel each other. This concept is illustrated in more detail below in connection with the description of FIGS. 3A and 3B. The constraining of the electric field of conductive wire 136 within coaxial cable 142 allows the coaxial cable to be placed next to or within metallic or other conductive objects without negatively affecting touch measurement performance. This shaping also prevents false detection of touches caused by objects near or in contact with coaxial cable 142.

The system of FIG. 2 may also include a driven shield 108 operable to shape the electric field generated by electrode 104. The electric field associated with the self capacitance of electrode 104 is projected away from the electrode 104 into the air while seeking to couple to ground or an object in close proximity to the electrode 104's electric field. Electric field lines may be projected into the air away from the electrode 104 in an omnidirectional pattern, that may be isotropic in the absence of external influences. In particular embodiments, driven shield 108 shapes the electric field of electrode 104 and thereby prevents the detection of proximity inputs occurring in a particular direction from electrode 104, such as the back side of electrode 104. For example, driven shield 108 may be configured to generate an electrical field in response to receiving drive signal 122. The electrical field generated by driven shield 108 may shape the electrical field of electrode 104. In particular embodiments, drive signal 122 used to drive driven shield 108 is the same signal or substantially similar to drive signal 121a used to drive electrode 104. Accordingly, the electrical fields generated by electrode 104 and driven shield 108 may have the same or substantially similar phases and polarities. At least a portion of the electric field generated by driven shield 108 in response to receiving drive signal 122 may extend towards electrode 104. This portion of the electric field of driven shield 108 may effectively reduce the length of the electric field lines of a portion of the electric field of electrode 104 that extend towards driven shield 108 because charges of the same polarity repel each other. This concept is illustrated in more detail below in connection with the description of FIGS. 4A and 4B.

Driven shield 108 may be made of any suitable material that emits an electrical field in response to receiving an electrical signal. Driven shield 108 may include one or more conductive materials. For example, driven shield 108 may include ITO, copper, silver, a copper- or silver-based material, other suitable material, or any combination thereof. Driven shield 108 may have any suitable shape, such as for example a disc, square, rectangle, thin line (e.g., a trace disposed on a horizontal or vertical section of a substrate), a wire, a loop, a patch, other suitable two dimensional or three dimensional shape, or any suitable combination of these.

In particular embodiments, driven shield 108 may be made of the same material as electrode 104 or may have the same shape and dimensions as electrode 108. In other particular embodiments, the composition or shapes and dimensions of driven shield 108 and electrode 104 may be substantially similar. For example, the area of driven shield 108 may be within ten percent of the area of electrode 104. In particular embodiments, driven shield 108 may be larger than electrode 104 such that the electric field generated by driven shield 108 is stronger than the electric field generated by electrode 104. This may further repel the relevant portion of the electric field of electrode 104.

Although the embodiment of FIG. 2 depicts a single electrode 104, driven shield 108, and coaxial cable 142, there may be multiple electrodes 104, driven shields 108, or coaxial cables 142 in a device. Each electrode 104 may be coupled to a respective coaxial cable 142, or a single coaxial cable 142 may be coupled to multiple electrodes 104. In various embodiments, the electrodes 104 of a device are measured independently. For example, multiple electrodes 104 may be measured in succession to determine if a touch has occurred at any of the electrodes.

In particular embodiments, driven shield 108 is disposed on a face of substrate 112 directly opposite electrode 104. For example, the depiction of substrate 112 in FIG. 2 may represent a portion of a larger substrate, such as a printed circuit board. If electrode 104 is located on one surface of substrate 112, driven shield 108 may be placed on a surface below electrode 104. For example, if substrate 112 is double-sided, electrode 104 and driven shield 108 may be placed on substrate 112 at the same (or substantially similar) locations on opposite faces of the printed circuit board. As another example, if substrate 112 has multiple layers, driven shield 108 may be placed below electrode 104 at any of the layers. In addition or as an alternative, a driven shield 108 may be placed in the same plane as electrode 104.

In certain situations, electrode 104 may need to be placed directly over, or in close proximity to, a conductive surface, such as electrical ground or a metal object. In such situations, capacitive coupling between electrode 104 and the conductive surface can result in absorption of the electric field of electrode 104 by the conductive surface. In particular embodiments, this absorption is eliminated or reduced by placing an insulator over the conductive surface and placing driven shield 108 on top of the insulator. Substrate 112 may be disposed on the driven shield 108 and electrode 104 may be disposed on the substrate 112 as depicted. In such embodiments, the electric field from driven shield 108 may force the electric field of electrode 104 away from the conductive surface, limiting the amount of absorption of the electric field by the conductive surface.

Substrate 112 is configured to electrically insulate electrode 104 from driven shield 108. Substrate 112 may represent any suitable dielectric material, such as PET, a printed circuit board, air, or other suitable insulating material. Substrate 112 may have any suitable number of layers or sides.

Touch-sensor controller 12a facilitates the measurement of touches at one or more electrodes 104. In the embodiment depicted, touch-sensor controller 12a includes drive unit 120 that is configured to generate drive signals 121. A drive signal may include any suitable signaling, such as one or more electrical pulses, a change in a voltage level of the drive signal, a toggling of the drive signal from high to low or low to high, or other suitable signaling. In particular embodiments, drive unit generates drive signal 121a and transmits drive signal 121a to electrode 104 through conductive wire 136 during measurement of a capacitance associated with electrode 104. Drive unit 120 may also generate drive signal 121b that is sent to driven shield 108 through conductive shield 144 (or simply transmitted to conductive shield 144 if no driven shield is present). In particular embodiments, drive signal 121b is the same signal or substantially the same signal as 121a. For example, drive signal 121b may have the same or substantially the same phase, polarity, and amplitude as drive signal 121a. Drive signal 121b may be sent directly to driven shield 108 through conductive shield 144 (in which case the drive signals 121 would have the same or substantially the same amplitudes) or may be buffered via buffer 128 before being transmitted to conductive shield 144. Buffer 128 may be a non-inverting amplifier that attenuates or amplifies drive signal 121b to generate drive signal 122. In particular embodiments, buffer 128 provides an adjustable gain for drive signal 121b. If coaxial cable 142 is especially long or tightly bundled with other wires, drive signal 121b may be amplified to account for coupling of the electric field of conductive shield 144 into surrounding objects. Such amplification may also reduce the chance of developing a charge difference between driven shield 108 and electrode 104, which may lead to decreased measurement performance. Drive signal 121b may be also be amplified by buffer 128 to increase the strength of the electric field of driven shield 108 and its effect on the electric field of electrode 104. As an example, if electric fields of equal strength from electrode 104 and driven shield 108 are desired and driven shield 108 is placed close to a conductive surface that absorbs a portion of the electric field of driven shield 108, signal 121b may be amplified to strengthen the electric field of driven shield 108 to the appropriate level. In particular embodiments, the electric field of driven shield 108 is driven to a level that will prevent the electric field of conductive wire 136 from coupling into an object outside of coaxial cable 142.

Because the drive signals 121 sent to conductive wire 136 (and electrode 104) and conductive shield 144 (and driven shield 108) have the same or substantially the same polarities and phases, the electric fields generated by conductive wire 136 (and electrode 104) and conductive shield 144 (and driven shield 108) will also have the same or substantially the same polarities and phases. Thus, portions of the respective electric fields from conductive wire 136 and conductive shield 144 that extend towards each other will repel each other. Similarly, portions of the respective electric fields from electrode 104 and driven shield 108 that extend towards each other will repel each other.

In various embodiments, the shaping of the electric field of electrode 104 may be adjusted by changing parameters including, at least, the size or shape of driven shield 108, the spacing between electrode 104 and driven shield 108, and the amplitude of the drive signal 122 for the driven shield.

After drive signal 121a is sent to electrode 104 through conductive wire 136 (or in between a series of drive signals 121a), sense unit 124 may analyze sense signal 123 from electrode 104. In particular embodiments, sense signal 123 may indicate a voltage of electrode 104. By analyzing sense signal 123, sense unit 124, alone in combination with processor unit 126, may determine a capacitance associated with electrode 104. The capacitance may be indicative of whether or not a touch or proximity input is occurring at electrode 104. Processor unit 126 may analyze results from various electrodes 104 to determine the location of a touch.

Processor unit 126 may communicate the results of sensing to device control unit 132. Device control unit 132 may be operable to control one or more functions of a device incorporating the system of FIG. 2. Device control unit 132 may initiate any suitable action of a device based on whether or not a touch or proximity input has occurred at electrode 104. For example, device control unit 132 may start or stop an application of the device based on a user's proximity to the device. As another example, device control unit 132 may activate back-lighting of a control panel of the device in response to a detection that an object is in proximity to the device. As a further example, the device may stay in a sleep or other low-power mode until an object's presence is detected. As yet another example, device control unit 132 may reduce radio frequency (RF) power emission of the device when a touch or proximity input is detected. Such embodiments may enable an intuitive user interface for the device and/or decreased power usage.

In a particular embodiment, touch sensor 10a is used to detect whether an object is in contact with a steering wheel of an automobile or other machine (such as a tractor). Controller 12a may be located remotely from touch sensor 10a and coaxial cable 142 may be located near other wires of the automobile or within a steering column of the automobile. Upon detection by the system of FIG. 2 that the operator of the automobile is no longer touching the steering wheel, an action may be initiated to increase the safety of the operator. For example, an alarm may sound, brakes may be applied, or an engine of the automobile may turn off.

Although certain steps are described above as being performed by certain components, in general, the steps may be performed by any suitable components. Although FIG. 2 illustrates a coaxial cable, electrode, substrate, driven shield, controller, and device control unit, FIG. 2 contemplates any number or arrangement of such components for detecting touches or proximity inputs. Although, the embodiment depicted in FIG. 2 shows a self capacitance system, various embodiments could include a mutual capacitance system.

Figure 3B:
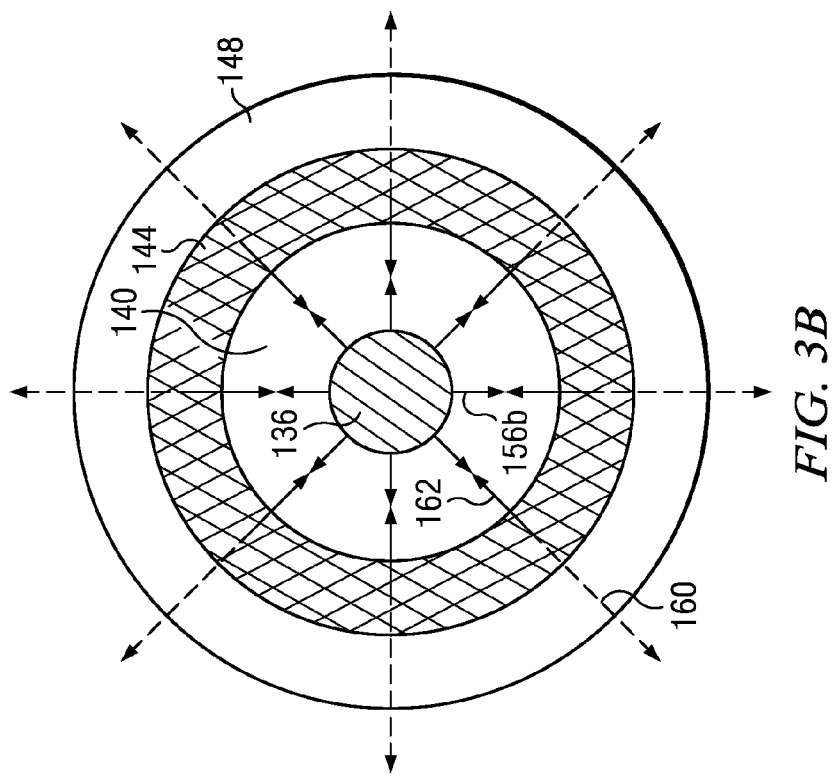
FIGS. 3A and 3B illustrates example electric fields of the conductive wire and conductive shield of FIG. 2.
Figure 3A:
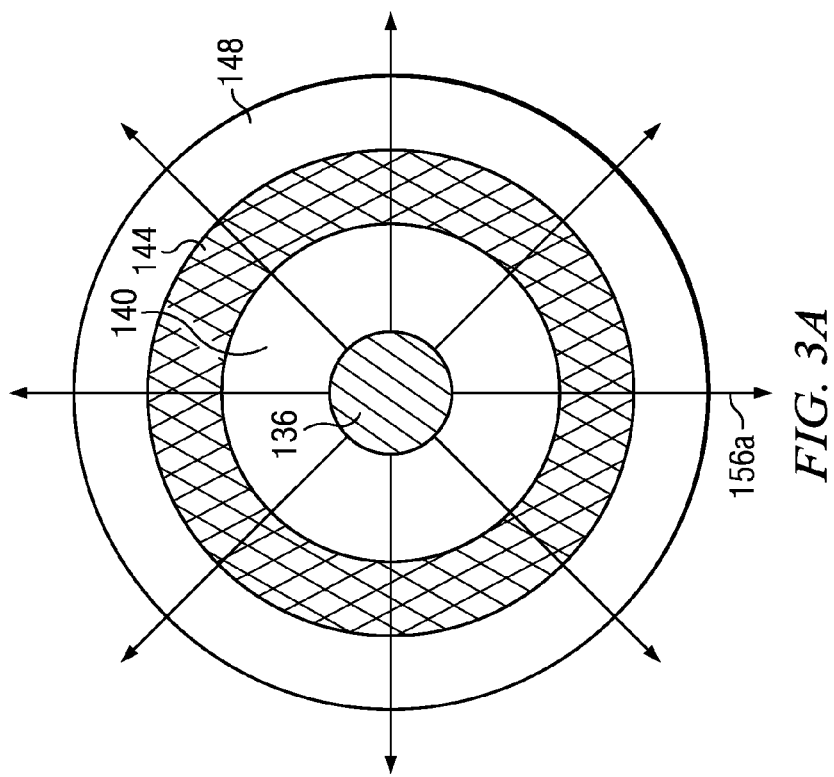

FIGS. 3A and 3B illustrates example electric fields of the conductive wire 136 and the conductive shield 144 of FIG. 2. FIG. 3A depicts the electric field of conductive wire 136 during a time that conductive shield 144 is not driven or is coupled to ground. As depicted, electric field lines 156a extend in every direction past insulating jacket 148. As noted above, this may be problematic in certain situations, since the electric field lines 156a may couple to objects outside of coaxial cable 142 and attenuate the drive and measurement signals carried by conductive wire 136.

FIG. 3B depicts the electric fields of conductive wire 136 and conductive shield 144. As depicted, conductive shield 144 generates electric field lines 160 that extend outwardly and electric field lines 162 that extend inwardly towards the central axis of coaxial cable 142. Electric field lines 162 repel the electric field lines 156b that extend outwardly from conductive wire 136. Accordingly, the electric field lines 156b are shorter than the electric field lines 156a shown in FIG. 3A. The shaping of electric field lines 156b ensure that the electric field of conductive wire 136 does not extend past the outside of coaxial cable 142. Accordingly, the electric field of conductive wire 136 will not couple into objects outside of coaxial cable 142.

Figure 4A:
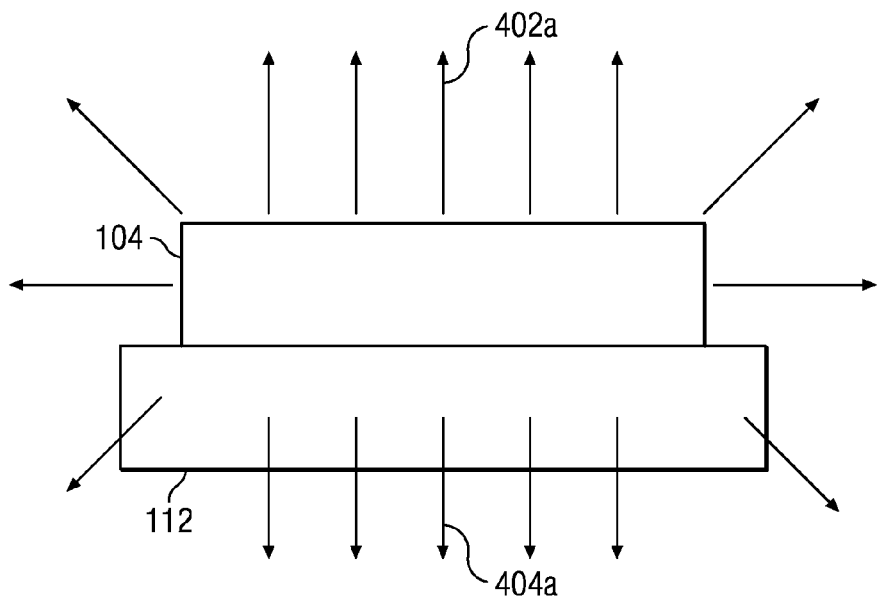
FIGS. 4A and 4B illustrates example electric fields of an electrode of the example touch sensor of FIG. 2 and an example driven shield.
Figure 4B:
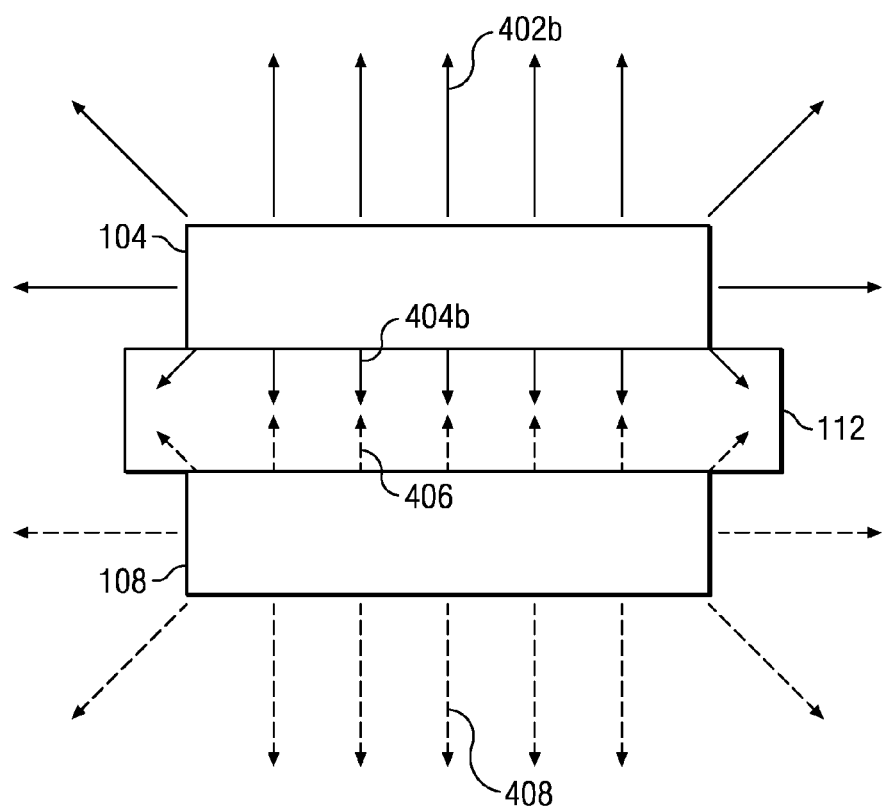

FIGS. 4A and 4B illustrates example electric fields of the electrode 104 of and the driven shield 108 of FIG. 2. FIG. 4A depicts the electric field of electrode 104. Electric field lines 402a are the electric field lines that extend towards the front and sides of electrode 104 and electric field lines 404a are the electric field lines that extend toward the back of electrode 104. As depicted, the electric field lines 402a and 404a of electrode 104 extend in every direction from electrode 104. In particular situations, the electric field may be isotropic. That is, the electric field lines 402a and 404a may be of equal length in each direction. This may be problematic in certain situations, since electrode 104 may respond to proximity inputs that occur in any direction, including the back of electrode 104.

FIG. 4B depicts the electric fields of electrode 104 and driven shield 108. The electric field lines 402b extending towards the front and sides of electrode 104 are of similar length to the electric field lines 402a in the absence of driven shield 108 as depicted in FIG. 4A. However, the electric field lines 404b that extend towards the back of electrode 104 are significantly shorter due to the repelling effect of electric field lines 406 of driven shield 108 that extend towards the front of driven shield 108. Accordingly, the electric field lines 404b of electrode 104 do not extend far enough to couple to an object placed at the back of driven shield 108 and thus cannot detect a touch or proximity input that occurs at the back of driven shield 108. While an object may be located within the electric field of driven shield 108 (e.g., an object may be present at the back of the driven shield), this presence will not be detected since only the electrode 104 (and not the driven shield 108) is sensed.

Although, FIGS. 2 and 4B depict driven shield 108 as being directly beneath electrode 104, one or more driven shields may be placed in any suitable locations to shape the electric field of electrode 104 in a desired fashion. For example, driven shield 108 may be placed at the side of electrode 104 or diagonal to electrode 104.

Figure 5:
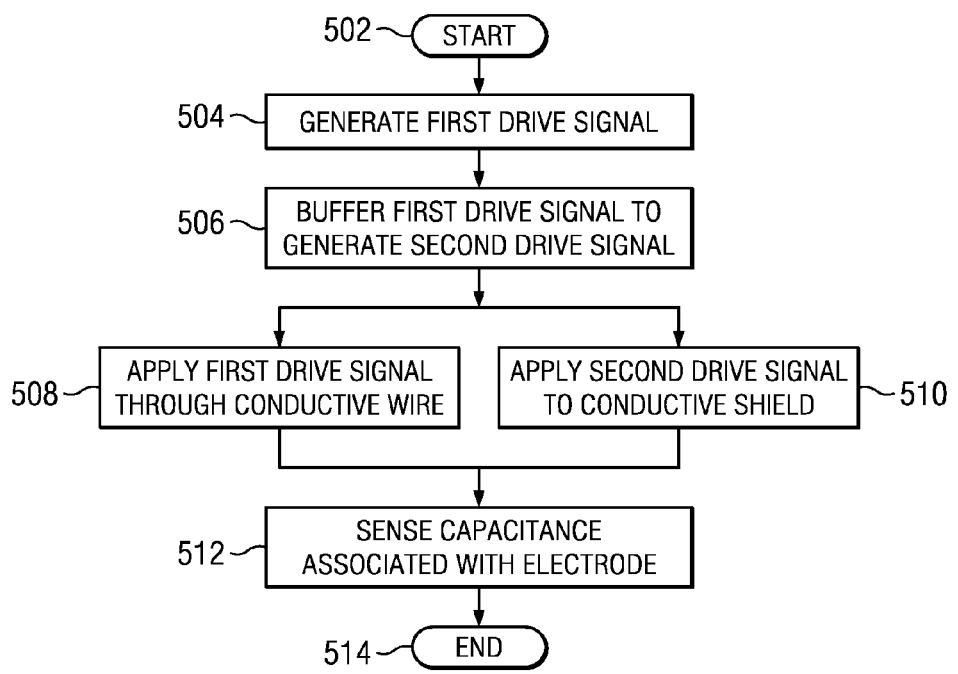
FIG. 5 illustrates an example method for shaping the electric field of the conductive wire of FIG. 2.

FIG. 5 illustrates an example method for shaping the electric field of a touch sensor. For illustrative purposes, FIG. 5 will be described with respect to the embodiment depicted in FIG. 2. The method may begin at step 502. At step 504, a first drive signal is generated. For example drive signal 121 may be generated. The first drive signal may be any suitable signal or combination of signals. For example, the first drive signal may be a series of electrical pulses. At step 506, the first drive signal is buffered to generate a second drive signal. As an example, drive signal 121 may be buffered to generate drive signal 122. Buffering may include passing the first drive signal through a non-inverting amplifier that amplifies the first drive signal. At step 508, the first drive signal is applied to a sensing electrode through a conductive wire. For example, drive signal 121*a* may be sent to electrode 104 through conductive wire 136. The first drive signal may induce the generation of an electric field by the conductive wire. This electric field may extend outwardly from the conductive wire.

Concurrently with step 508, the second drive signal is applied to a conductive shield at step 510. For example, drive signal 122 may be applied to conductive shield 144. The second drive signal may induce the generation of an electric field by the conductive shield. This electric field may be similar in phase and polarity to the electric field generated by the conductive wire. This electric field may influence the electric field generated by the conductive wire such that one or more portions of the electric field do not extend as far as they would in the absence of the electric field of the conductive wire.

At step 512, a capacitance associated with the sense electrode is measured. For example, sense unit 124 may analyze a sense signal 123 from electrode 104 and processor unit 126 may determine a self capacitance of electrode 104 and the method ends at step 514. The capacitance measured may be used to determine whether an object is present (e.g., within a range of the sensing electrode). This determination may then be used to initiate a device action. The action may be initiated in response to determining that an object is present or in response to determining that an object is not present. Any suitable device action may be performed, such as stopping or starting a device or an application of the device.

Particular embodiments may repeat the steps of the method of FIG. 5, where appropriate. Moreover, although this disclosure describes and illustrates particular steps of the method of FIG. 5 as occurring in a particular order, this disclosure contemplates any suitable steps of the method of FIG. 5 occurring in any suitable order. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Particular embodiments of the present disclosure may provide one or more or none of the following technical advantages. In particular embodiments, a conductive shield may shape the electric field of a conductive wire such that the electric field does not couple into objects outside of a coaxial cable. Particular embodiments may allow a touch sensor to be placed remotely from a touch-sensor controller. Particular embodiments may increase the safety of particular devices.

Herein, reference to a computer-readable non-transitory storage medium or media may include one or more semiconductor-based or other integrated circuits (ICs) (such, as for example, a field-programmable gate array (FPGA) or an application-specific IC (ASIC)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards, SECURE DIGITAL drives, any other suitable computer-readable non-transitory storage medium or media, or any suitable combination of two or more of these, where appropriate. A computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A device comprising:
a capacitive touch sensor configured to store an amount of charge indicative of whether an object is within a range of the capacitive touch sensor;
a conductive wire coupled to the capacitive touch sensor, the conductive wire configured to transport a first drive signal to the capacitive touch sensor to charge the capacitive touch sensor, the conductive wire generating a first electric field when transporting the first drive signal;
a dielectric layer surrounding a first portion of the conductive wire;
a conductive shield surrounding the dielectric layer and the first portion of the conductive wire, the conductive shield configured to transport a second drive signal, the conductive shield generating a second electric field when transporting the second drive signal, the second electric field shaping the first electric field generated by the conductive wire;
a control unit coupled to the conductive wire and the conductive shield, the control unit configured to generate the first drive signal and the second drive signal;
an amplifier configured to amplify the first drive signal to generate the second drive signal;

a sensing unit configured to sense whether an object is within the range of the capacitive touch sensor based on the amount of charge stored by the capacitive touch sensor; and a logic circuit in communication with the sensing unit and configured to initiate an action of the device based upon a determination by the sensing unit of whether an object is within the range of the capacitive touch sensor.

2. The device of claim 1, wherein the action initiated by the logic circuit includes turning off the engine of a machine in response to a determination that an object is not within the range of the capacitive touch sensor.

3. The device of claim 1, further comprising a metal steering column of a machine, the metal steering column surrounding at least a portion of the conductive wire and at least a portion of the shielding cable.

4. The device of claim 1, wherein the capacitive touch sensor is a second portion of the conductive wire that is not surrounded by the conductive shield or the dielectric layer.

5. The device of claim 1, wherein the first portion of the conductive wire has a length of at least 10 centimeters.

6. The device of claim 1, wherein the amplifier is implemented using a buffer configured to amplify the first drive signal to generate the second drive signal.

7. The device of claim 1, wherein the first drive signal and the second drive signal have the same phase and polarity.

8. The device of claim 1, further comprising another conductive shield configured to generate a third electric field in response to receiving the second drive signal, the third electric field shaping a fourth electric field generated by the capacitive touch sensor in response to receiving the first drive signal.

9. An apparatus comprising:
a capacitive touch sensor configured to store an amount of charge indicative of whether an object is within a range of the capacitive touch sensor;

a conductive wire coupled to the capacitive touch sensor, the conductive wire configured to transport a first drive signal to the capacitive touch sensor to charge the capacitive touch sensor, the conductive wire generating a first electric field when transporting the first drive signal; and a conductive shield surrounding a first portion of the conductive wire, the conductive shield configured to transport a second drive signal, the second drive signal having an amplitude that is greater than an amplitude of the first drive signal, the conductive shield generating a second electric field when transporting the second drive signal, the second electric field shaping the first electric field generated by the conductive wire.

10. The apparatus of claim 9, wherein the capacitive touch sensor is a second portion of the conductive wire that is not surrounded by the shielding cable.

11. The apparatus of claim 9, further comprising an amplifier configured to amplify the first drive signal to generate the second drive signal.

12. The apparatus of claim 11, wherein the amplifier is implemented using a buffer configured to amplify the first drive signal to generate the second drive signal.

13. The apparatus of claim 9, wherein the conductive wire is a center conductor of a coaxial cable.

14. The apparatus of claim 9, further comprising a dielectric layer between the conductive shield and the conductive wire, the dielectric layer surrounding the first portion of the conductive wire.

15. The apparatus of claim 9, further comprising another conductive shield configured to generate a third electric field in response to receiving the second drive signal, the third electric field shaping a fourth electric field generated by the capacitive touch sensor in response to receiving the first drive signal.

16. The apparatus of claim 9, wherein the first drive signal and the second drive signal have the same phase and polarity.

17. The apparatus of claim 9, wherein the capacitive touch sensor is a conductive plate.

18. A method comprising:
generating, by a control unit, a first drive signal and a second drive signal, the second drive signal having an amplitude that is greater than an amplitude of the first drive signal;

emitting, by a conductive wire coupled to a capacitive touch sensor, a first electric field that extends in a plurality of directions in response to reception of the first drive signal; and shaping, by a conductive shield that surrounds the conductive wire, at least a portion of the first electric field that extends from the capacitive touch sensor towards the conductive shield by generating a second electric field in response to reception of the second drive signal.

19. The method of claim 18 further comprising:
measuring an amount of charge stored by the capacitive touch sensor by transferring the charge from the capacitive touch sensor to the control unit through the conductive wire; and detecting whether an object is within a range of the capacitive touch sensor based on the measured amount of charge.

20. The method of claim 18, wherein the first drive signal and the second drive signal have the same phase and polarity.

* * * * *